United States Patent
Schicktanz

(10) Patent No.: US 9,941,473 B2
(45) Date of Patent: Apr. 10, 2018

(54) METHOD FOR CLOSELY CONNECTING AN ORGANIC OPTOELECTRONIC COMPONENT TO A CONNECTION PIECE, CONNECTION STRUCTURE FOR FORCE-LOCKING CONNECTING, AND OPTOELECTRONIC COMPONENT DEVICE

(71) Applicant: OSRAM OLED GmbH, Regensburg (DE)

(72) Inventor: Simon Schicktanz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 693 days.

(21) Appl. No.: 14/408,962

(22) PCT Filed: Jun. 20, 2013

(86) PCT No.: PCT/EP2013/062900
§ 371 (c)(1),
(2) Date: Dec. 18, 2014

(87) PCT Pub. No.: WO2013/190049
PCT Pub. Date: Dec. 27, 2013

(65) Prior Publication Data
US 2015/0263284 A1    Sep. 17, 2015

(30) Foreign Application Priority Data
Jun. 21, 2012   (DE) .................. 10 2012 210 484

(51) Int. Cl.
*H01L 51/00*    (2006.01)
*F21V 19/00*    (2006.01)
(Continued)

(52) U.S. Cl.
CPC ............ *H01L 51/0001* (2013.01); *F16B 2/02* (2013.01); *F16B 17/00* (2013.01); *F16B 19/00* (2013.01);
(Continued)

(58) Field of Classification Search
CPC .......... F16B 17/00; F16B 19/00; F16B 19/04; H01L 151/0001; H01L 151/52; H01L 151/56
See application file for complete search history.

(56) References Cited

U.S. PATENT DOCUMENTS 8,511,843 B2    8/2013  Hofmann et al.
2002/0125815 A1    9/2002  Wakita
(Continued)

FOREIGN PATENT DOCUMENTS

DE    102006060781 A1    4/2008
DE    202010008324 U1    1/2011
(Continued)

OTHER PUBLICATIONS

International Search Report issued for PCT/EP2013/062900 dated Oct. 15, 2013.

*Primary Examiner* — Jonathan P Masinick
(74) *Attorney, Agent, or Firm* — Viering, Jentschura & Partner mbB

(57) ABSTRACT

Various embodiments relate to a method for closely connecting an organic optoelectronic component to a connection piece, including forming a first cavity in the organic optoelectronic component, wherein the first cavity has at least a first opening, introducing a connecting structure through the first opening into the first cavity, wherein the connecting structure has a first fixing area, wherein the first fixing area is configured partially complementarily to the form of the first cavity, forming a second cavity in a
(Continued)

connection piece, wherein the second cavity has at least a second opening, wherein the second cavity is configured partially complementarily to the form of the second fixing area, and introducing a second fixing area through the second opening into the second cavity, and forming a friction-fitting connection of the organic optoelectronic component with the connecting piece once the connecting structure has been introduced into the first and the second cavity.

15 Claims, 10 Drawing Sheets

(51) Int. Cl.
| | | |
|---|---|---|
| F16B 2/02 | (2006.01) | |
| F16B 17/00 | (2006.01) | |
| F16B 19/00 | (2006.01) | |
| F16B 19/04 | (2006.01) | |
| F16B 33/00 | (2006.01) | |
| H01L 51/52 | (2006.01) | |
| H01L 51/56 | (2006.01) | |
| F21Y 105/00 | (2016.01) | |
| F21Y 115/15 | (2016.01) | |

(52) U.S. Cl.
CPC .............. *F16B 19/04* (2013.01); *F16B 33/00* (2013.01); *F21V 19/0025* (2013.01); *H01L 51/52* (2013.01); *H01L 51/56* (2013.01); *F21Y 2105/00* (2013.01); *F21Y 2115/15* (2016.08); *H01L 51/524* (2013.01); *Y10T 24/32* (2015.01); *Y10T 24/42* (2015.01); *Y10T 29/41* (2015.01); *Y10T 403/7062* (2015.01); *Y10T 403/7075* (2015.01)

(56) References Cited

U.S. PATENT DOCUMENTS

| | | | |
|---|---|---|---|
| 2011/0233569 A1* | 9/2011 | Ko | ...................... H01L 51/0001 257/88 |
| 2012/0061131 A1* | 3/2012 | Lee | ......................... B32B 15/08 174/257 |
| 2014/0203253 A1 | 7/2014 | Goeoetz et al. | |
| 2014/0293604 A1 | 10/2014 | Diekmann et al. | |

FOREIGN PATENT DOCUMENTS

| | | | | |
|---|---|---|---|---|
| DE | 102011005808 A1 | 9/2012 | | |
| DE | 102011077687 A1 | 12/2012 | | |
| DE | 102011082209 A1 | 3/2013 | | |
| EP | 2204605 A1 | 7/2010 | | |
| EP | 2442008 A1 | 4/2012 | | |
| KR | 20100113196 A | 10/2010 | | |
| WO | WO 0172091 A1 * | 9/2001 | ................ | C02F 3/04 |
| WO | 2010022101 A2 | 2/2010 | | |
| WO | 2011068277 A1 | 6/2011 | | |
| WO | 2011161608 A1 | 12/2011 | | |
| WO | WO 2012017498 A1 * | 2/2012 | ......... | H01L 27/3246 |
| WO | WO 2015025692 A1 * | 2/2015 | ........... | B23K 26/009 |

* cited by examiner

FIG 4
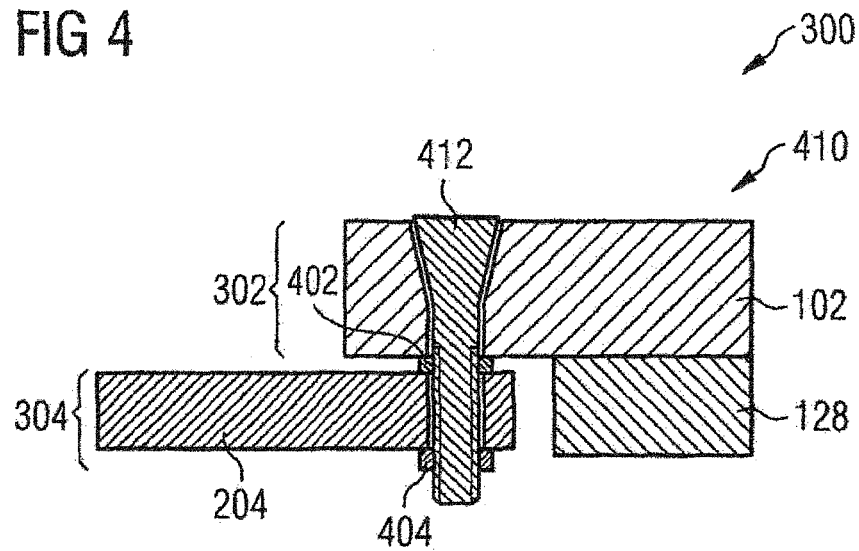
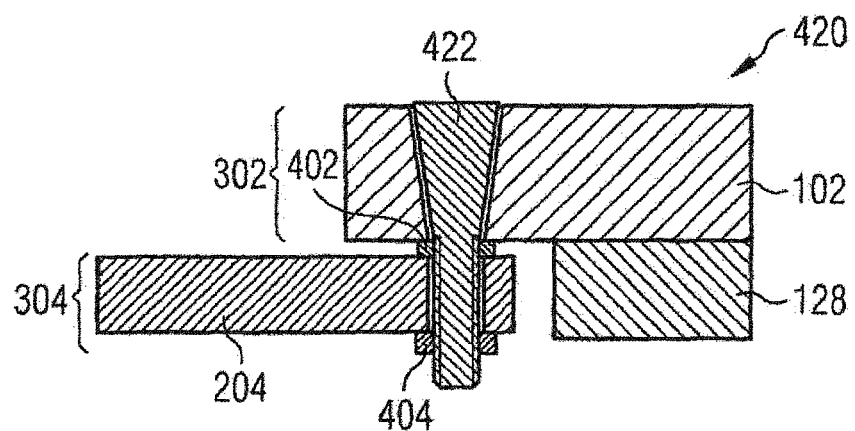
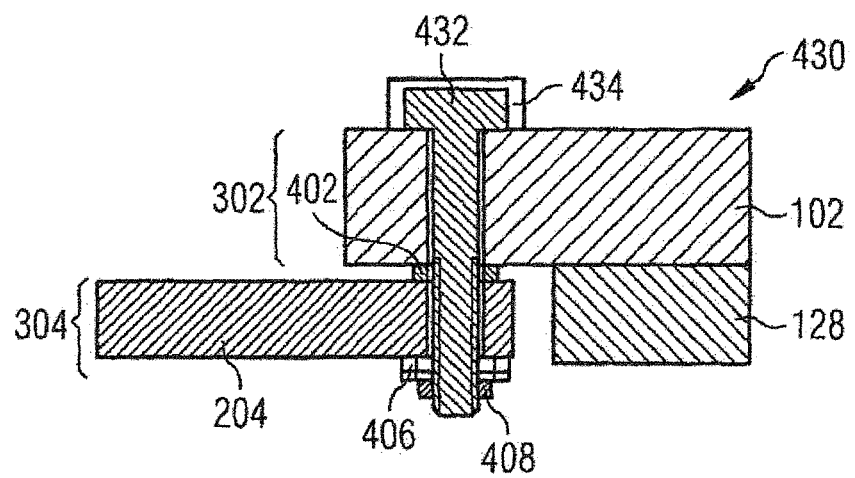

FIG 6
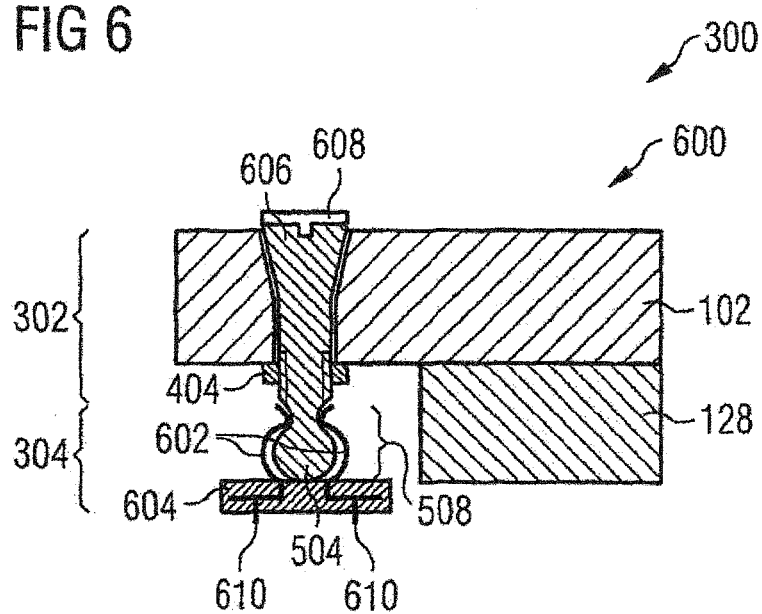
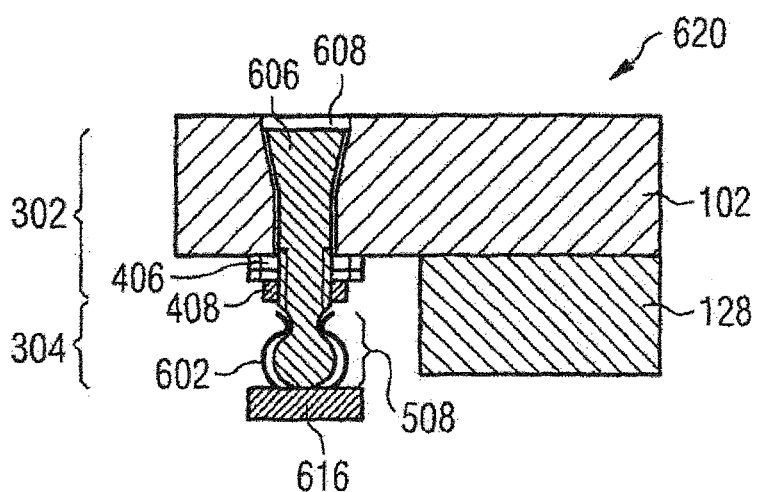

FIG 7
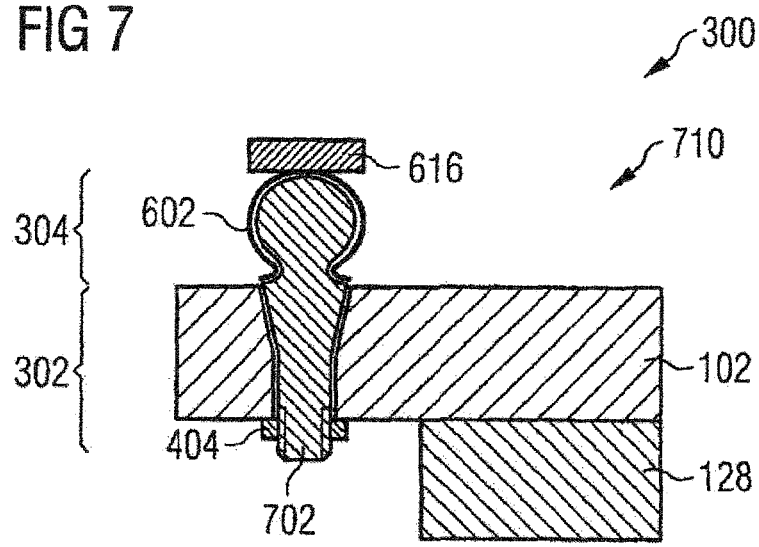
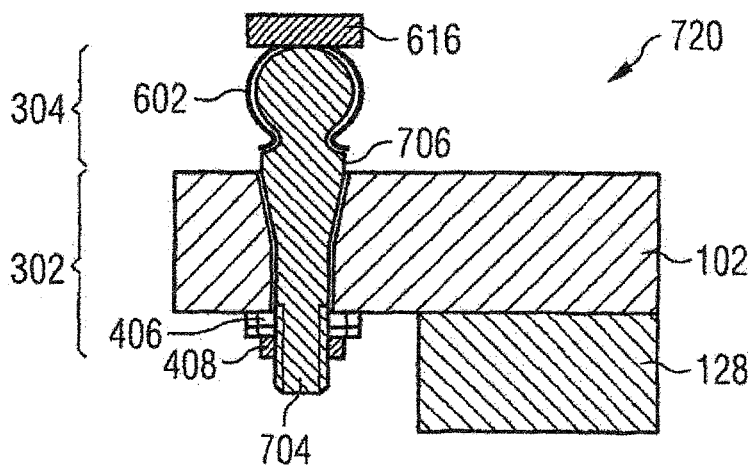

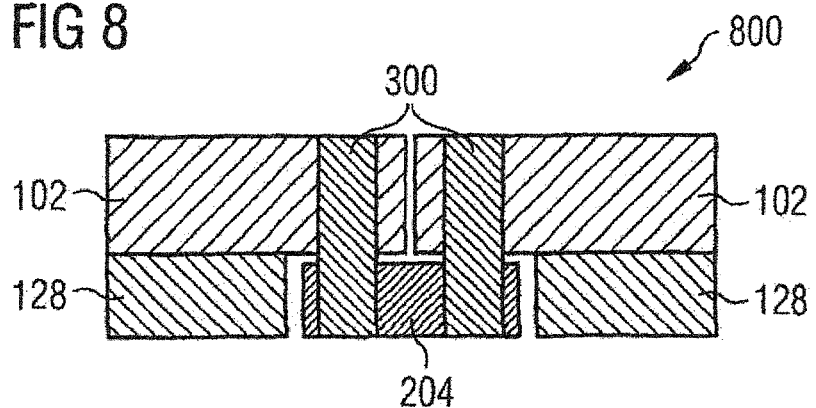
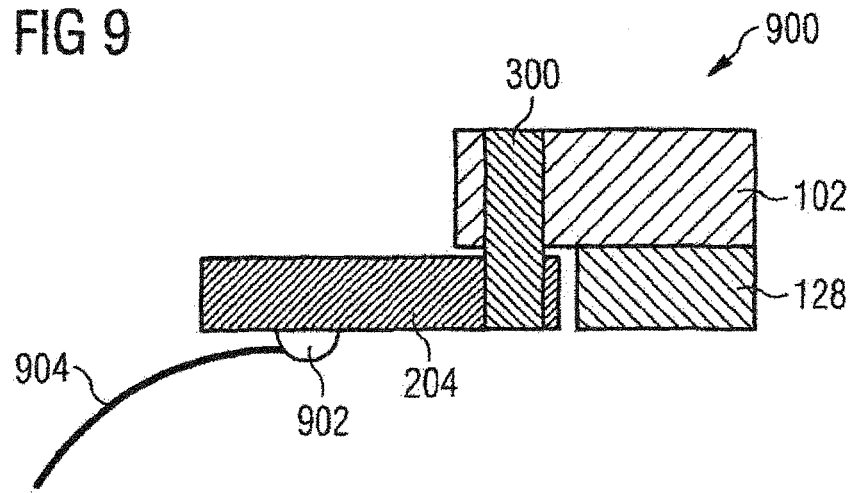
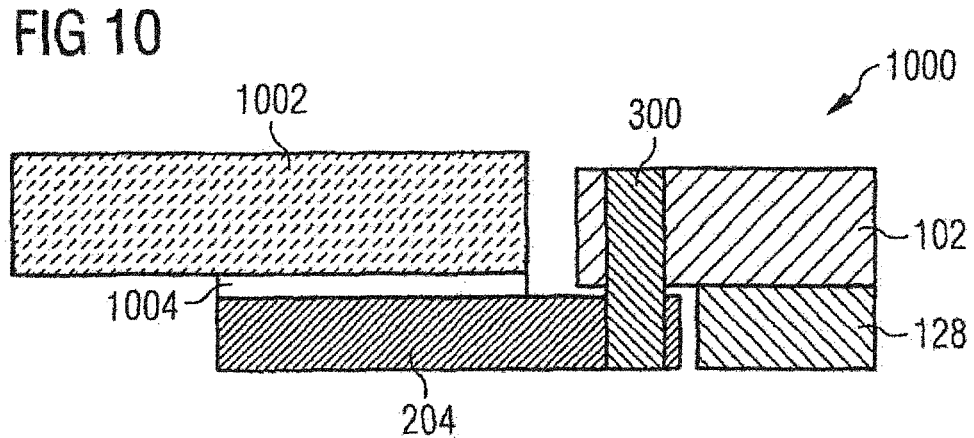

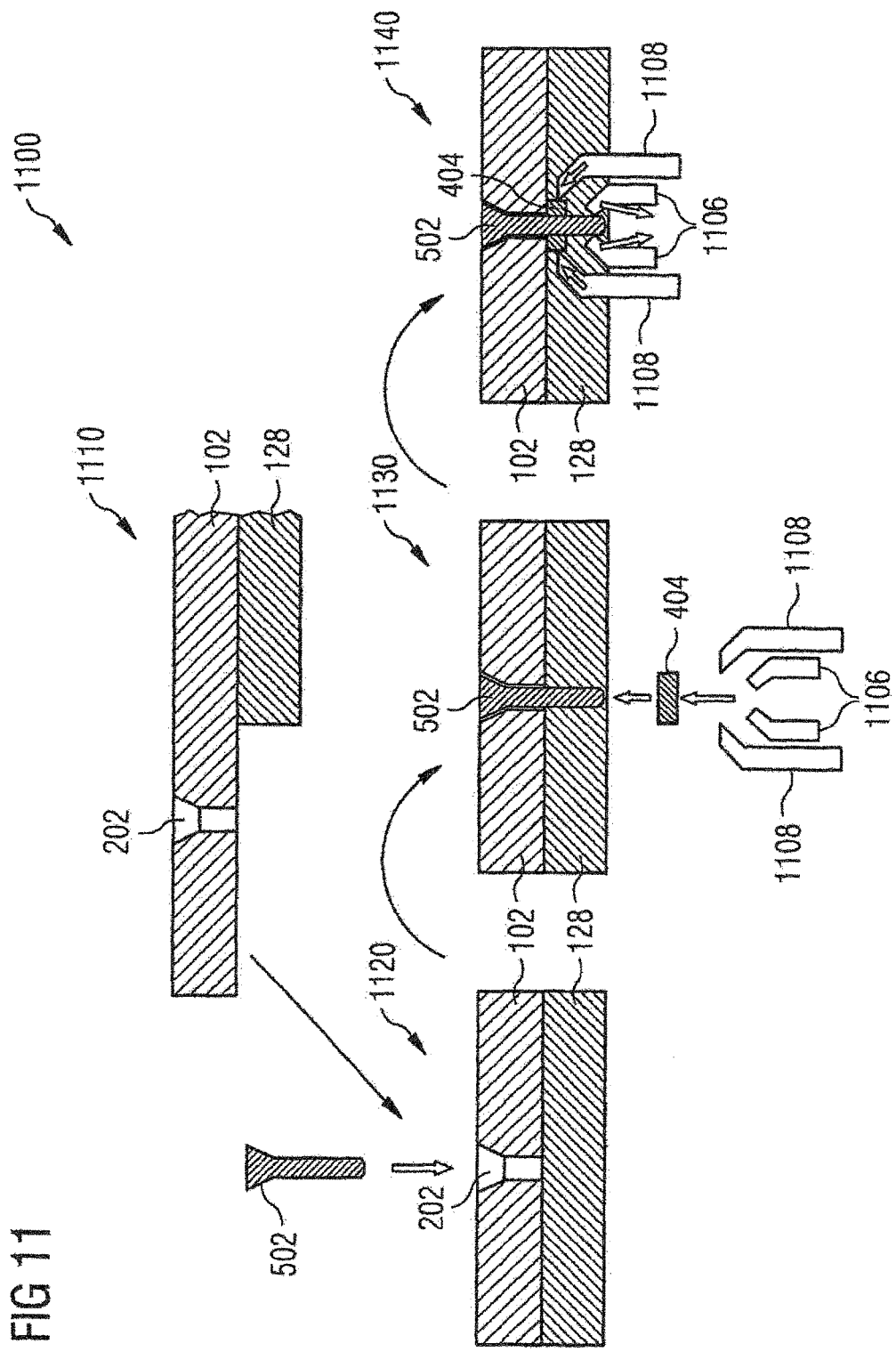

METHOD FOR CLOSELY CONNECTING AN ORGANIC OPTOELECTRONIC COMPONENT TO A CONNECTION PIECE, CONNECTION STRUCTURE FOR FORCE-LOCKING CONNECTING, AND OPTOELECTRONIC COMPONENT DEVICE

RELATED APPLICATIONS

The present application is a national stage entry according to 35 U.S.C. § 371 of PCT application No.: PCT/EP2013/062900 filed on Jun. 20, 2013, which claims priority from German application No.: 10 2012 210 484.4 filed on Jun. 21, 2012, and is incorporated herein by reference in its entirety.

TECHNICAL FIELD

In various embodiments, a method for closely connecting an organic optoelectronic component to a connection piece, a connection structure for force-locking connecting, and an optoelectronic component device are provided.

BACKGROUND

An optoelectronic component (e.g. an organic light emitting diode (OLED), for example a white organic light emitting diode (WOLED), a solar cell, etc.) on an organic basis is usually distinguished by a mechanical flexibility and moderate production conditions. Compared with a component composed of inorganic materials, an optoelectronic component on an organic basis can be produced potentially cost-effectively on account of the possibility of large-area production methods (e.g. roll-to-roll production methods).

An organic optoelectronic component, for example an organic light emitting diode or an organic solar cell, can have an anode and a cathode with an organic functional layer system therebetween. These layers can be applied on a carrier and coated with an encapsulation layer.

Conventionally, two methods are known for the electrical linking of the organic optoelectronic component.

In one conventional method, the optoelectronic component is mechanically fixed by a clamping device in a housing, frame or the like. The electrical linking can be formed by clamping contacts or spring pins on contact strips of the organic optoelectronic component.

In a further conventional method, connection pieces, for example flexible printed circuit boards (flex-PCB) or metal tapes are applied to an optoelectronic component by various methods, for example adhesive bonding by electrically conductive adhesives (anisotropic conductive film bonding—ACF bonding), a friction welding process (ultrasonic bonding) or the like. In this case, the optoelectronic component can in turn be mechanically fixed by a clamping device. For the electrical linking of the organic optoelectronic component, said connection pieces can be electrically contact-connected to electrodes by soldering connections or by electromechanical positively locking engagement.

The exposed surface of the connection pieces, for example chromium, and the soldering tin are often not compatible, i.e. miscible, with one another. An arbitrary flow of the soldering tin on the exposed surface of the connection piece can occur as a result. The flowing soldering tin can then make it more difficult to precisely position the terminals on the soldering location.

Conventional methods for restricting the solderable regions use soldering resist or soldering pad forms (constrictions).

SUMMARY

In various embodiments, a method for closely connecting an organic optoelectronic component to a connection piece, a connection structure for force-locking connecting and an optoelectronic component device are provided which make it possible for an organic optoelectronic component to be electrically and/or mechanically connected to a connection piece in a positively locking manner in all directions of movement.

In the context of this description, an organic substance can be understood to mean a carbon compound which, regardless of the respective state of matter, is present in chemically uniform form and is characterized by characteristic physical and chemical properties. Furthermore, in the context of this description, an inorganic substance can be understood to mean a compound which, regardless of the respective state of matter, is present in chemically uniform form and is characterized by characteristic physical and chemical properties, without carbon or a simple carbon compound. In the context of this description, an organic-inorganic substance (hybrid substance) can be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture can be understood to mean something which has constituents consisting of two or more different substances, the constituents of which are very finely dispersed, for example. A substance class should be understood to mean a substance or a substance mixture including one or more organic substance(s), one or more inorganic substance(s) or one or more hybrid substance(s). The term "material" can be used synonymously with the term "substance".

The connection of a first body to a second body can be embodied in a positively locking manner, in a force-locking manner and/or in a cohesive manner. The connections can be embodied in a releasable manner, i.e. as reversible, for example a screw connection, a hook and loop fastener. However, the connections can also be embodied in a non-releasable manner, i.e. as irreversible, for example a riveted connection, an adhesive connection. A non-releasable connection can be separated in this case only by destroying the connection means (riveted connections, adhesive connections).

In the case of a positively locking connection, the movement of the first body can be restricted by a surface of the second body, wherein the first body moves perpendicularly, i.e. normally, in the direction of the restricting surface of the second body. A pin (first body) in a blind hole (second body) can be restricted in terms of movement for example in five of the six spatial directions.

In the case of a force-locking connection, a static friction can restrict a movement of the first body parallel to the second body. One example of a force-locking connection may be for example the self-locking of a screw in a complementarily shaped thread. In this case, self-locking can be understood to mean a resistance by friction.

In the case of a cohesive connection, the first body can be connected to the second body by atomic and/or molecular forces. Cohesive connections can often be non-releasable connections, for example adhesive connections.

In various embodiments, a method for closely connecting an organic optoelectronic component to a connection piece is provided, the method including: forming a first cavity in an organic optoelectronic component, wherein the first cavity has at least one first opening; introducing a connection structure through the first opening into the first cavity, wherein the introduced connection structure has a first fixing region, wherein the first fixing region of the connection structure is designed at least partly complementarily to the form of the first cavity; forming a second cavity in a connection piece, wherein the second cavity has at least one second opening; wherein the second cavity is designed at least partly complementarily to the form of the second fixing region of the introduced connection structure; and introducing a second fixing region of the connection structure through the second opening into the second cavity.

In the context of this description, a cavity having only one opening can be understood to mean a blind hole. A cavity having two openings can also be designated as a hole in the context of this description. In this case, a cavity can have at least one geometrical shape or at least one part of a geometrical shape from the group of the following shapes: a parallelepiped, a rectangle, a pyramid, a sphere, a sphere segment, a cone or a cylinder.

In one configuration of the method, at least two opposite openings can be formed in the first cavity.

In one configuration of the method, during the process of introducing the connection structure into the first cavity, at least one opening of the first cavity can have an invariant form.

In one configuration of the method, during the process of introducing the connection structure into the first cavity, at least one opening of the first cavity can have a variable form.

Changing the form of an opening may include, for example, enlarging the diameter of the opening. During the process of enlarging the diameter, for example, parts of the opening can be laterally displaced.

In one configuration of the method, the connection structure, after the process of introducing or during the process of introducing the connection structure into the first cavity of the organic light emitting diode, can be fixed in a positively locking manner on or with the organic light emitting diode.

Changing the diameter of the opening can be embodied as reversible, for example. During the process of displacing parts of the opening, for example, at least one type of a spring can be tensioned. In this case, the spring force can bring about a snap-action fitting of the displaced parts of the opening into tapered regions of the connection piece.

In one configuration of the method, fixing the connection structure on or with a region of the organic optoelectronic component in a positively locking manner may include a process from the group of the following processes: screwing or riveting.

In one configuration of the method, the connection structure, after the process of introducing or during the process of introducing the connection structure into the first cavity of the organic optoelectronic component, can be fixed in a force-locking manner on or with a region of the organic optoelectronic component.

In one configuration of the method, fixing the connection structure on or with a region of the organic optoelectronic component in a force-locking manner may include a process from the group of the following processes: screwing; snap-action fitting; clamping; or a magnetic attraction, wherein a part of the first fixing region is embodied in a magnetic fashion at least in the case of a magnetic attraction.

In one configuration of the method, at least two opposite openings can be formed in the second cavity.

In one configuration of the method, during the process of introducing the connection structure into the second cavity, at least one opening of the second cavity can have an invariant form.

In one configuration of the method, during the process of introducing the connection structure into the second cavity, at least one opening of the second cavity can have a variable form.

In one configuration of the method, the connection structure, after the process of introducing or during the process of introducing the connection structure into the second cavity of the connection piece, can be fixed in a positively locking manner on or with the connection piece.

In one configuration of the method, fixing the connection structure on or with a region of the connection piece in a positively locking manner may include a process from the group of the following processes: screwing or riveting.

In one configuration of the method, the connection structure, after the process of introducing or during the process of introducing the connection structure into the second cavity of the connection piece, can be fixed in a force-locking manner on or with a region of the connection piece.

In one configuration of the method, fixing the connection structure on or with a region of the connection piece in a force-locking manner may include a process from the group of the following processes: screwing; snap-action fitting; clamping; or a magnetic attraction, wherein a part of the first fixing region is embodied in a magnetic fashion.

Snap-action fitting can be formed by a type of spring, for example, wherein the spring can be tensioned during the process of introducing the fixing structure into a cavity. The connection structure can have a tapered region in the fixing region. A tapered region can be a region having a smaller diameter, for example. As a result, the spring can be at least partly relaxed in the tapered region of the connection structure. The relaxed spring in the tapered region can then act as the fixing of the connection structure in the cavity.

The spring can be formed at the opening or the connection structure. A spring at the opening of the cavity or as a cavity can be formed in this sense for example in a manner similar or identical to a spiral spring or leg spring.

A spring at the connection structure can be formed in this sense for example in a manner similar or identical to a barb.

However, a spring can be understood in this sense also as elasticity of the substance or of the substance mixture of the connection structure and/or of the body in which the cavity is formed.

In one configuration of the method, during or after the process of forming the close connection of the organic optoelectronic component to the connection piece by the connection structure, an electrical connection between the organic optoelectronic component and the connection piece can be additionally formed.

In one configuration of the method, the connection structure can firstly be connected to the connection piece in a positively locking manner and/or in a force-locking manner and only afterward can the connection structure be connected to the organic optoelectronic component in a positively locking manner and/or in a force-locking manner.

In one configuration of the method, during the process of introducing the connection structure into the first cavity and/or into the second cavity, the connection structure can be simultaneously or additionally introduced into at least one further cavity, wherein the further cavity is embodied in the first cavity or in the second cavity, and wherein the further cavity has at least one opening.

In one configuration of the method, the connection structure can be formed in such a way that the connection structure closely connects the first body to the second body, wherein the first body and/or the second body have/has two or more connection regions. A connection structure for closely linking a body with two or more connection regions can be designed for example as a multiple connection, for example a multiple plug.

In one configuration of the method, the method may furthermore include holding the connection structure during at least one process of fixing the connection structure, wherein holding the connection structure includes fixing the connection structure about at least one rotation axis.

In one configuration of the method, the method can furthermore include withdrawing the connection structure from the first cavity and/or from the second cavity without damage.

In one configuration of the method, the organic optoelectronic component can be designed for example as an organic light emitting diode or as an organic solar cell.

In various embodiments, a connection structure for force-locking connecting is provided, the connection structure at least including: a first fixing region and a second fixing region; wherein the first fixing region is designed for a force-locking and/or positively locking connection of the connection structure to a first body; wherein the second fixing region is designed for a force-locking and/or positively locking connection to a second body; and wherein the connection structure is designed in such a way that the first body is connected to the second body in a force-locking manner by the connection structure.

In one configuration of the connection structure, the first fixing region and/or the second fixing region can be formed in such a way that forming the close connection includes at least one process from the group of the following processes: screwing; riveting; snap-action fitting; clamping; and/or a magnetic attraction, wherein a part of the first fixing region is embodied in a magnetic fashion.

In one configuration of the connection structure, the first fixing region and/or the second fixing region can be designed in a manner similar or identical to one of the connection structures of the group of the following connection structures: a rivet, a screw, an internal thread, a pin, a clamp, and/or a magnetic connection, wherein a part of the first fixing region is embodied in a magnetic fashion.

In one configuration of the connection structure, the connection structure can be designed as an electrical conductor or an electrical insulator.

In one configuration of the connection structure, the connection structure may furthermore include an intermediate region between the first fixing region and the second fixing region, wherein the intermediate region physically connects the first fixing region to the second fixing region.

In one configuration of the connection structure, the intermediate region can have a holding device, wherein during the process of fixing the holding device the connection structure is formed in a manner stationary about at least one rotation axis of the connection structure.

In one configuration of the connection structure, the connection structure can be designed in such a way that the form of the connection structure has at least one geometrical symmetry relative to at least one axis, for example a mirror symmetry or a rotational symmetry.

In one configuration of the connection structure, the connection structure can be formed in such a way that the force-locking connection of the first body to the second body is formed as reversible, for example as a screw connection, clamping device, magnetic connection or the like.

In one configuration of the connection structure, the connection structure can be formed in such a way that the connection structure closely connects the first body to the second body, wherein the first body and/or the second body have/has two or more connection regions. A connection structure for closely linking a body with two or more connection regions can be designed for example as a multiple connection, for example a multiple plug.

In various embodiments, an optoelectronic component device is provided, the optoelectronic component device including: an organic light emitting diode, a connection piece and a connection structure between the organic optoelectronic component and the connection piece: wherein the connection structure has a first fixing region and a second fixing region; wherein the organic light emitting diode has a first cavity and the connection piece has a second cavity; wherein the first fixing region is formed at least partly in the first cavity, and wherein the second fixing region is formed at least partly in the second cavity; wherein the first fixing region is designed at least partly complementarily to the first cavity and/or the second fixing region is designed at least partly complementarily to the second cavity; wherein the connection structure physically and/or electrically connects the organic light emitting diode to the connection piece.

In this case, the connection structure can enable fixing of the organic optoelectronic component relative to the connection piece in all spatial directions.

In one configuration of the device, the device can furthermore include a holder, wherein the organic light emitting diode is held by the holder.

In one configuration of the device, the connection piece can be formed as part of the holder.

In one configuration of the device, at least two opposite openings can be formed in the first cavity.

In one configuration of the device, at least one opening of the first cavity can have an invariant form.

In one configuration of the device, at least one opening of the first cavity can have a variable form.

In one configuration of the device, the connection structure can be fixed on or with a region of the organic optoelectronic component in a positively locking manner.

In one configuration of the device, the positively locking fixing of the connection structure on or with a region of the organic optoelectronic component may include a positively locking connection from the following group: a screw connection; or a riveted connection.

In one configuration of the device, the connection structure can be fixed on or with a region of the organic optoelectronic component in a force-locking manner.

In one configuration of the device, the force-locking fixing of the connection structure may include a force-locking connection from the following group: a screw connection; a spring; a clamp; or a magnetic attraction, wherein at least one part of the first fixing region is embodied in a magnetic fashion in the case of a magnetic attraction.

In one configuration of the device, at least two opposite openings can be formed in the second cavity.

In one configuration of the device, at least one opening of the second cavity can have an invariant form.

In one configuration of the device, at least one opening of the second cavity can have a variable form.

In one configuration of the device, the connection structure can be fixed on or with the connection piece in a positively locking manner.

In one configuration of the device, the positively locking fixing may include a connection from the following group: a screw connection; or a riveted connection.

In one configuration of the device, the connection structure can be fixed on or with a region of the connection piece in a force-locking manner.

In one configuration of the device, the force-locking fixing may include a connection from the following group: a screw connection; a snap-action fitting; a clamp; or a magnetic attraction, wherein a part of the second fixing region is designed in a magnetic fashion.

In one configuration of the device, the first cavity and/or the second cavity can additionally have at least one further cavity, wherein the further cavity has at least one opening.

In one configuration of the device, the connection structure can be designed as an electrical conductor or an electrical insulator.

In one configuration of the device, the connection structure can have an intermediate region between the first fixing region and the second fixing region, wherein the intermediate region physically connects the first fixing region to the second fixing region.

In one configuration of the device, the intermediate region can have a holding device, wherein the holding device is designed in such a way that the connection structure is formed in a stationary manner about at least one rotation axis of the connection structure.

In one configuration of the device, the intermediate region can have a tensioning element, wherein the tensioning element is designed in such a way that the positively locking connection is mechanically tensioned.

In one configuration of the device, an electrical connection between the organic optoelectronic component and the connection piece can additionally be formed by the connection structure and/or the tensioning element. However, the tensioning element can also be understood as a part of the connection structure.

In one configuration, the tensioning element can be formed in an electrically conductive fashion, wherein an electrical connection between organic light emitting diode and connection piece can be formed by the tensioning element.

In one configuration of the device, the connection structure can be designed in such a way that the form of the connection structure has at least one geometrical symmetry relative to at least one axis, for example a mirror symmetry or a rotational symmetry.

In one configuration of the device, the connection structure can be formed in such a way that the force-locking connection of the first body to the second body is formed as reversible.

In one configuration of the device, the organic optoelectronic component can be designed for example as an organic light emitting diode or as an organic solar cell.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 4 shows a schematic cross-sectional view of different, close linkings of an organic optoelectronic component, in accordance with various configurations;

FIG. 6 shows a schematic cross-sectional view of different, close linkings, in accordance with various configurations;

FIG. 7 shows a schematic cross-sectional view of different, close linkings, in accordance with various configurations;

FIG. 8 shows a schematic cross-sectional view of close linkings of a plurality of optoelectronic components, in accordance with various configurations;

FIG. 9 shows a schematic cross-sectional view of a close linking of an organic optoelectronic component, in accordance with various configurations;

FIG. 10 shows a schematic cross-sectional view of a close linking of an organic optoelectronic component, in accordance with various configurations;

FIG. 11 shows a schematic illustration of an organic optoelectronic component in the method for forming a close linking, in accordance with various configurations.

DETAILED DESCRIPTION

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

Figure 1:
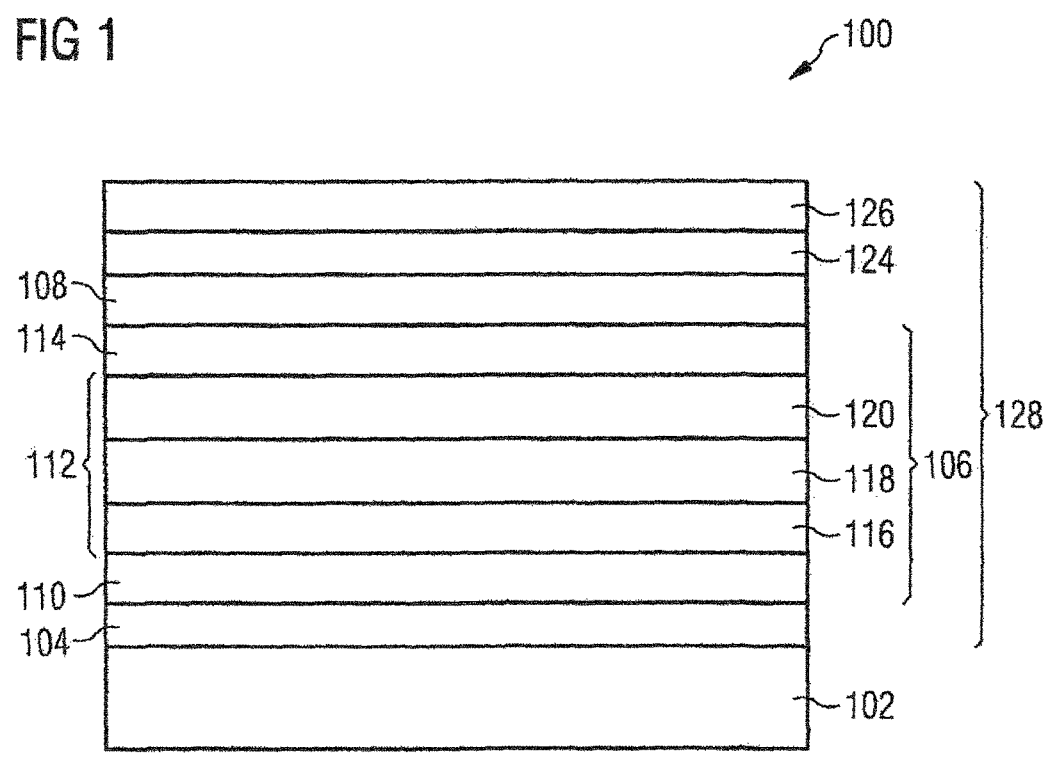
FIG. 1 shows a schematic cross-sectional view of an optoelectronic component, in accordance with various embodiments.

FIG. 1 shows a schematic cross-sectional view of an optoelectronic component, in accordance with various embodiments.

The optoelectronic component 100, for example an electronic component 100 providing electromagnetic radiation, for example a light emitting component 100, for example in the form of an organic light emitting diode 100, can have a carrier 102. The carrier 102 may serve for example as a carrier element for electronic elements or layers, for example light emitting elements. By way of example, the carrier 102 may include or be formed from glass, quartz, and/or a semiconductor material or any other suitable substance. Furthermore, the carrier 102 may include or be formed from a plastic film or a laminate including one or including a plurality of plastic films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN). The carrier 102 may include one or more of the substances mentioned above.

In one configuration, the carrier 102 may include or be formed from a metal or a metal compound, for example copper, silver, gold, platinum or the like. A carrier 102 including a metal or a metal compound may also be embodied as a metal film or a metal-coated film.

The carrier 102 may be embodied as translucent or even transparent.

In various embodiments, the term "translucent" or "translucent layer" may be understood to mean that a layer is transmissive to light, for example to the light generated by the light emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" may be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion.

For the case where, for example, a light emitting monochromatic or emission spectrum-limited electronic component is intended to be provided, it suffices for the optically translucent layer structure to be translucent at least in a partial range of the wavelength range of the desired monochromatic light or for the limited emission spectrum.

In various embodiments, the organic light emitting diode 100 (or else the light emitting components in accordance with the embodiments that have been described above or will be described below) can be designed as a so-called top and bottom emitter. A top and/or bottom emitter can also be designed as an optically transparent component, for example a transparent organic light emitting diode.

In various embodiments, a barrier layer 104 may optionally be arranged on or above the carrier 102.

In one configuration, the barrier layer 104 may be designed in addition or instead as a planarization layer 104 for reducing the surface roughness of the carrier 102.

The barrier layer 104 may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 may have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An electrically active region 106 of the light emitting component 100 may be arranged on or above the barrier layer 104. The electrically active region 106 may be understood as the region of the light emitting component 100 wherein an electric current flows for the operation of the light emitting component 100. In various embodiments, the electrically active region 106 may include a first electrode 110, a second electrode 114 and an organic functional layer structure 112, as will be explained in even greater detail below.

In this regard, in various embodiments, the first electrode 110 (for example in the form of a first electrode layer 110) may be applied on or above the barrier layer 104 (or, if the barrier layer 104 is not present, on or above the carrier 102). The first electrode 110 (also designated hereinafter as bottom electrode 110) may be formed from an electrically conductive substance, such as, for example, a metal or a transparent conductive oxide (TCO) or a layer stack including a plurality of layers of the same metal or different metals and/or the same TCO or different TCOs. Transparent conductive oxides are transparent conductive substances, for example metal oxides, such as, for example, zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 110 may include a metal; for example Ag, Pt, Au, Mg, Al, Ba, In, Ca, Sm or Li, and compounds, combinations or alloys of these materials.

In various embodiments, the first electrode 110 may be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various embodiments, the first electrode 110 may include one or a plurality of the following substances as an alternative or in addition to the abovementioned substances: networks composed of metallic nanowires and nanoparticles, for example composed of Ag; networks composed of carbon nanotubes; graphene particles and graphene layers; networks composed of semiconducting nanowires.

Furthermore, the first electrode 110 may include electrically conductive polymers or transition metal oxides or transparent electrically conductive oxides.

In various embodiments, the first electrode 110 and the carrier 102 can be formed as translucent or transparent. In the case where the first electrode 110 includes or is formed from a metal, the first electrode 110 may have for example a layer thickness of less than or equal to approximately 25 nm, for example a layer thickness of less than or equal to approximately 20 nm, for example a layer thickness of less than or equal to approximately 18 nm. Furthermore, the first electrode 110 can have for example a layer thickness of greater than or equal to approximately 10 nm, for example a layer thickness of greater than or equal to approximately 15 nm. In various embodiments, the first electrode 110 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 110 includes or is formed from a transparent conductive oxide (TCO), the first electrode 110 may have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 110 is formed from, for example, a network composed of metallic nanowires, for example composed of Ag, which may be combined with conductive polymers, a network composed of carbon nanotubes which can be combined with conductive polymers, or from graphene layers and composites, the first electrode 110 may have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 110 can be formed as an anode, that is to say as a hole-injecting electrode, or as a cathode, that is to say as an electron-injecting electrode.

The first electrode 110 can have a first electrical contact pad, to which a first electrical potential (provided by an energy source (not illustrated), for example a current source or a voltage source) may be applied. Alternatively, the first electrical potential can be applied to the carrier 102 and then be applied indirectly to the first electrode 110 via said carrier. The first electrical potential can be, for example, the ground potential or some other predefined reference potential.

Furthermore, the electrically active region 106 of the light emitting component 100 may have an organic functional layer structure 112, which is applied or is formed on or above the first electrode 110.

The organic functional layer structure 112 may include one or a plurality of emitter layers 118, for example including fluorescent and/or phosphorescent emitters, and one or a plurality of hole-conducting layers 116 (also designated as hole transport layer(s) 116). In various embodiments, one or a plurality of electron-conducting layers 120 (also designated as electron transport layer(s) 120) can alternatively or additionally be provided.

Examples of emitter materials which can be used in the light emitting component 100 in accordance with various embodiments for the emitter layer(s) 118 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)$_3$ (tris(2-phenylpyridine)iridium III), red phosphorescent Ru(dtb-bpy)$_3$*2(PF$_6$) (tris[4,4'-di-tert-butyl(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited by thermal evaporation, for example. Furthermore, it is possible to use polymer emitters, which can be deposited, in particular, by a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) 118 of the light emitting component 100 can be selected for example such that the light emitting component 100 emits white light. The emitter layer(s) 118 may include a plurality of emitter materials that emit in different colors (for example blue and yellow or blue, green and red); alternatively, the emitter layer(s) 118 can also be constructed from a plurality of partial layers, such as a blue fluorescent emitter layer 118 or blue phosphorescent emitter layer 118, a green phosphorescent emitter layer 118 and a red phosphorescent emitter layer 118. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure 112 may generally include one or a plurality of electroluminescent layers. The one or the plurality of electroluminescent layers may include organic polymers, organic oligomers, organic monomers, organic small, non-polymeric molecules ("small molecules") or a combination of these substances. By way of example, the organic functional layer structure 112 may include one or a plurality of electroluminescent layers embodied as a hole transport layer 116, so as to enable for example in the case of an OLED an effective hole injection into an electroluminescent layer or an electroluminescent region. Alternatively, in various embodiments, the organic functional layer structure 112 may include one or a plurality of functional layers embodied as an electron transport layer 120, so as to enable for example in an OLED an effective electron injection into an electroluminescent layer or an electroluminescent region. By way of example, tertiary amines, carbazole derivatives, conductive polyaniline or polyethylene dioxythiophene can be used as material for the hole transport layer 116. In various embodiments, the one or the plurality of electroluminescent layers can be embodied as an electroluminescent layer.

In various embodiments, the hole transport layer 116 may be applied, for example deposited, on or above the first electrode 110, and the emitter layer 118 may be applied, for example deposited, on or above the hole transport layer 116. In various embodiments, the electron transport layer 120 may be applied, for example deposited, on or above the emitter layer 120.

In various embodiments, the organic functional layer structure 112 (that is to say for example the sum of the thicknesses of hole transport layer(s) 116 and emitter layer(s) 118 and electron transport layer(s) 120) may have a layer thickness of a maximum of approximately 1.5 μm, for example a layer thickness of a maximum of approximately 1.2 μm, for example a layer thickness of a maximum of approximately 1 μm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 112 can have for example a stack of a plurality of organic light emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 112 can have for example a stack of two, three or four OLEDs arranged directly one above another, in which case for example organic functional layer structure 112 can have a layer thickness of a maximum of approximately 3 µm.

The light emitting component 100 may optionally generally include further organic functional layers, for example arranged on or above the one or the plurality of emitter layers 118 or on or above the electron transport layer(s) 120, which serve to further improve the functionality and thus the efficiency of the light emitting component 100.

The second electrode 114 (for example in the form of a second electrode layer 114) may be applied on or above the organic functional layer structure 112 or, if appropriate, on or above the one or the plurality of further organic functional layer structures.

In various embodiments, the second electrode 114 may include or be formed from the same substances as the first electrode 110, metals being particularly suitable in various embodiments.

In various embodiments, the second electrode 114 (for example for the case of a metallic second electrode 114) may have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 114 may generally be formed in a similar manner to the first electrode 110, or differently than the latter. In various embodiments, the second electrode 114 may be formed from one or more of the substances and with the respective layer thickness, as described above in connection with the first electrode 110. In various embodiments, both the first electrode 110 and the second electrode 114 are formed as translucent or transparent. Consequently, the light emitting component 100 illustrated in FIG. 1 can be designed as a top and/or bottom emitter (to put it another way, as a transparent light emitting component 100).

The second electrode 114 may be formed as an anode, that is to say as a hole-injecting electrode, or as a cathode, that is to say as an electron-injecting electrode.

The second electrode 114 may have a second electrical terminal, to which a second electrical potential (which is different than the first electrical potential), provided by the energy source, may be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation 108, for example in the form of a barrier thin-film layer/thin-film encapsulation 108, can optionally also be formed on or above the second electrode 114 and thus on or above the electrically active region 106.

In the context of this application, a "barrier thin-film layer" 108 or a "barrier thin film" 108 can be understood to mean, for example, a layer or a layer structure which is suitable for forming a barrier against chemical impurities or atmospheric substances, in particular against water (moisture) and oxygen. In other words, the barrier thin-film layer 108 is formed in such a way that OLED-damaging substances such as water, oxygen or solvent cannot penetrate through it or at most very small proportions of said substances can penetrate through it.

In accordance with one configuration, the barrier thin-film layer 108 may be formed as an individual layer (to put it another way, as a single layer). In accordance with an alternative configuration, the barrier thin-film layer 108 may include a plurality of partial layers formed one on top of another. In other words, in accordance with one configuration, the barrier thin-film layer 108 may be formed as a layer stack. The barrier thin-film layer 108 or one or a plurality of partial layers of the barrier thin-film layer 108 can be formed for example by a suitable deposition method, e.g. by an atomic layer deposition (ALD) method in accordance with one configuration, e.g. a plasma enhanced atomic layer deposition (PEALD) method or a plasmaless atomic layer deposition (PLALD) method, or by a chemical vapor deposition (CVD) method in accordance with another configuration, e.g. a plasma enhanced chemical vapor deposition (PECVD) method or a plasmaless chemical vapor deposition (PLCVD) method, or alternatively by other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer 108 having a plurality of partial layers, all the partial layers can be formed by an atomic layer deposition method. A layer sequence including only ALD layers can also be designated as a "nanolaminate".

In accordance with an alternative configuration, in the case of a barrier thin-film layer 108 including a plurality of partial layers, one or a plurality of partial layers of the barrier thin-film layer 108 may be deposited by a different deposition method than an atomic layer deposition method, for example by a vapor deposition method.

In accordance with one configuration, the barrier thin-film layer 108 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 108 includes a plurality of partial layers, all the partial layers can have the same layer thickness. In accordance with another configuration, the individual partial layers of the barrier thin-film layer 108 can have different layer thicknesses. In other words, at least one of the partial layers can have a different layer thickness than one or more other partial layers.

In accordance with one configuration, the barrier thin-film layer 108 or the individual partial layers of the barrier thin-film layer 108 can be formed as a translucent or transparent layer. In other words, the barrier thin-film layer 108 (or the individual partial layers of the barrier thin-film layer 108) can consist of a translucent or transparent substance (or a substance combination that is translucent or transparent).

In accordance with one configuration, the barrier thin-film layer 108 or (in the case of a layer stack having a plurality of partial layers) one or a plurality of the partial layers of the barrier thin-film layer 108 may include or be formed from one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 108 or (in the case of a layer stack having a plurality of partial layers) one or a plurality of the partial layers of the barrier thin-film layer 108 may include one or a plurality of high refractive index substances, to put it another way one or a plurality of substances having a high refractive index, for example having a refractive index of at least 2.

In various embodiments, on or above the barrier thin-film layer 108, it is possible to provide an adhesive and/or a protective lacquer 124, by which, for example, a cover 126 (for example a glass cover 126) is fixed, for example adhesively bonded, on the barrier thin-film layer 108. In various embodiments, the optically translucent layer composed of adhesive and/or protective lacquer 124 may have a layer thickness of greater than 1 µm, for example a layer thickness of several µm. In various embodiments, the adhesive may include or be a lamination adhesive.

In various embodiments, light-scattering particles may also be embedded into the layer of the adhesive (also designated as adhesive layer), which particles can lead to a further improvement in the color angle distortion and the coupling-out efficiency. In various embodiments, the light-scattering particles provided may be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2O_a$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 114 and the layer composed of adhesive and/or protective lacquer 124, an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, the adhesive may be designed in such a way that it itself has a refractive index which is less than the refractive index of the cover 126. Such an adhesive may be for example a low refractive index adhesive such as, for example, an acrylate which has a refractive index of approximately 1.3. Furthermore, a plurality of different adhesives forming an adhesive layer sequence can be provided.

Furthermore, it should be pointed out that, in various embodiments, an adhesive 124 can also be completely dispensed with, for example in embodiments in which the cover 126, for example composed of glass, is applied to the barrier thin-film layer 108 by plasma spraying, for example.

In one configuration, the cover 126, for example composed of glass, may be applied for example by a frit connection (glass frit bonding/glass soldering/seal glass bonding) by a conventional glass solder in the geometrical edge regions of the organic optoelectronic component 100 with the barrier thin-film layer 108.

In various embodiments, the cover 126 and/or the adhesive 124 can have a refractive index (for example at a wavelength of 633 nm) of 1.55.

Furthermore, in various embodiments, one or a plurality of antireflective layers (for example combined with the encapsulation 108, for example the barrier thin-film layer 108) can additionally be provided in the light emitting component 100.

For the further description, the optoelectronic component 100 can be regarded in a simplified manner as an optoelectronic layer stack 128 on a carrier 102.

Figure 2:
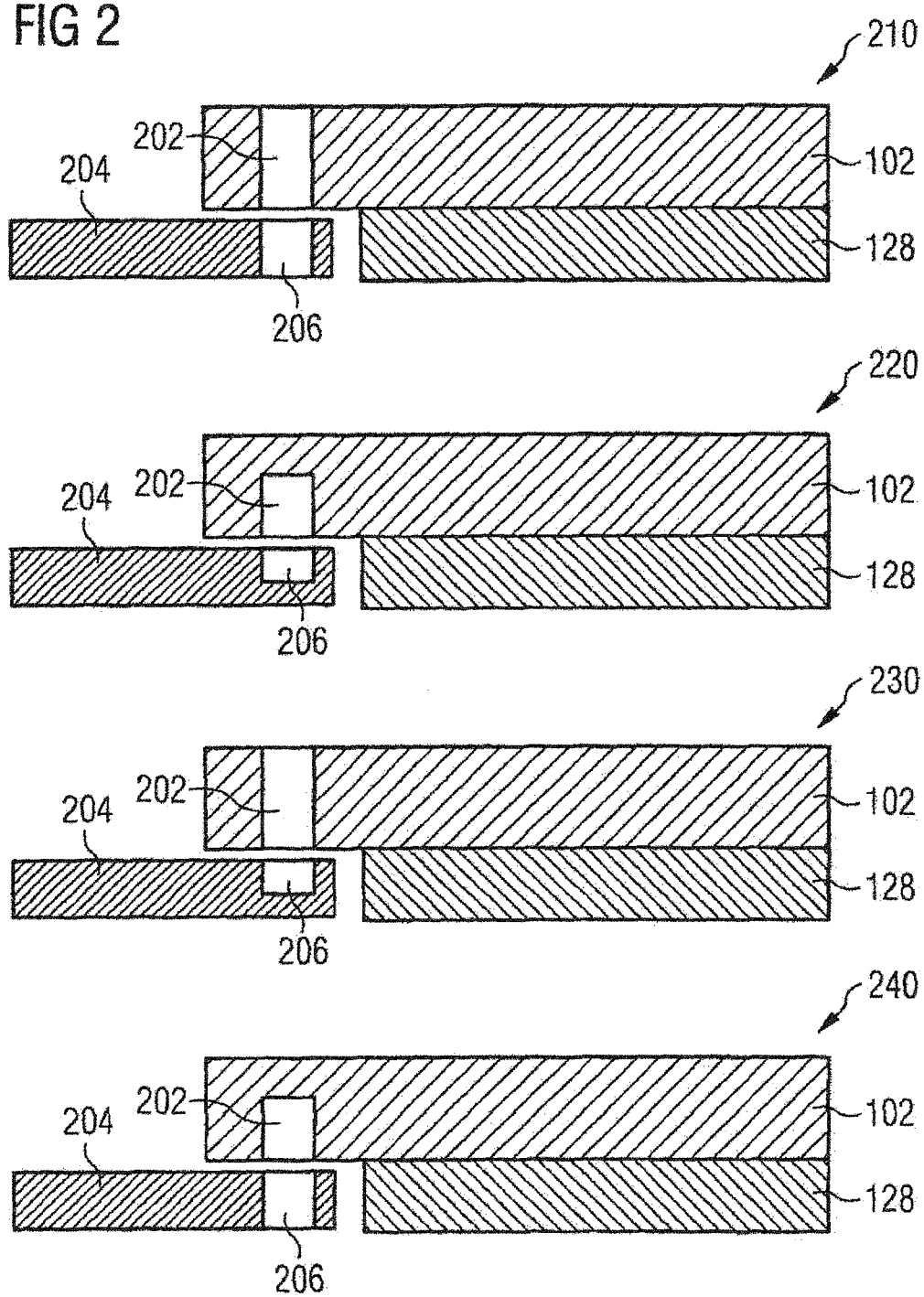
FIG. 2 shows a schematic cross-sectional view of an organic optoelectronic component, in accordance with various configurations.

FIG. 2 shows a schematic cross-sectional view of an organic optoelectronic component, in accordance with various configurations.

The geometrical edge of a carrier 102 with an optoelectronic layer stack 128 of an optoelectronic component 100 is illustrated schematically.

The carrier 102 and the optoelectronic layer stack 128 may be designed for example in accordance with one of the configurations in FIG. 1. The connection piece 204 may be formed in a manner similar or identical to the carrier 102 or can be for example part of a housing or the like.

The carrier 102 can be aligned above a connection piece 204 for the purpose of mechanical and/or electrical linking 300 with a connection piece 404.

In the edge region of the carrier 102 without the optoelectronic layer stack 128 and in the connection piece 204, respectively at least one first cavity 202 can be formed in the carrier 102 and at least one second cavity 206 may be formed in the connection piece 204, wherein the first cavity 202 and the second cavity 206 each have at least one opening.

A selection of different configurations 210, 220, 230, 240 of cavities 202, 206 is furthermore illustrated.

In this case, the first cavity 202 may be surrounded at least partly by the carrier 102. In this case, the second cavity 206 may be surrounded at least partly by the connection piece 204. Partial surrounding can also be understood to mean a clamping device, for example a leg spring, on or at the carrier 102 and respectively connection piece 204, for example in accordance with one of the configurations in the description of FIG. 6 and/or FIG. 7. The illustrated forms of the cavities 202, 206 should therefore be understood merely as examples of the physical principle of the form of cavities, i.e. for example of a hole or of a blind hole.

A hole can be understood as a cavity having at least one opening, for example two openings. The two or more openings can be arranged opposite one another and/or arbitrarily with respect to one another.

The cavities 202, 206 should be formed relative to the carrier 102 and the connection piece 204 in such a way that the first cavity 202 of the carrier 102 and the second cavity 206 of the connection piece 204 can be aligned one above another.

The cavity can have a geometrical shape or a part of a geometrical shape from the group of the following shapes: a parallelepiped, a rectangle, a pyramid, a sphere, a sphere segment, a cone or a cylinder.

In this case, the cavities 202, 206 can have an identical, similar or different shape.

The connection piece 204 can be embodied in an electrically conductive fashion or can have electrically conductive regions, for example as a flexible printed circuit board (flex-PCB).

The carrier 102 can be embodied in an electrically conductive fashion or can have an electrically conductive surface, for example by the first electrode 110 and/or second electrode 114 being exposed in the edge region of the carrier, i.e. in the vicinity of the first cavity 202.

The second electrode 114, for being exposed in the edge region of the optoelectronic component, can be electrically insulated relative to further layers of the organic optoelectronic component, for example by a resist, for example including polyimide.

The cavities 202, 206 can be formed in the carrier 102 and/or in the connection piece 204 for example by drilling, for example by a mechanical drill, a laser beam, for example laser ablation or a water jet, for example water jet cutting. A water jet may be particularly suitable in the case of carriers 102 including glass.

Figure 3:
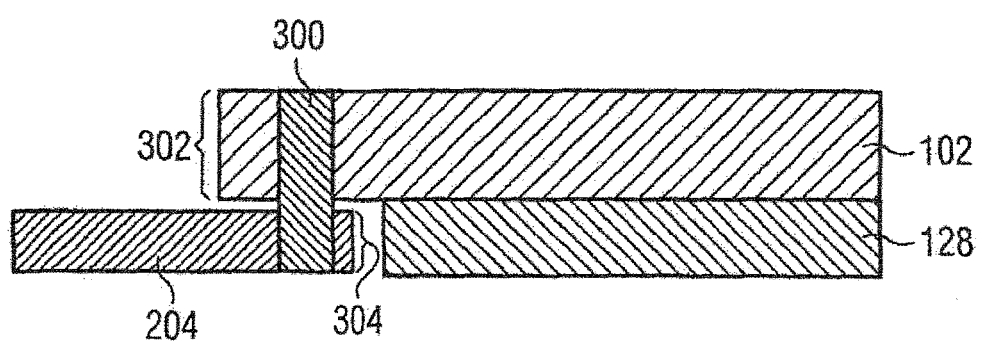
FIG. 3 shows a schematic cross-sectional view of an organic optoelectronic component, in accordance with various configurations.

FIG. 3 shows a schematic cross-sectional view of an organic optoelectronic component, in accordance with various configurations.

The cavities 202, 206 of the carrier 102 and of the connection piece 204, said cavities being aligned one above another, can be aligned for the positively locking linking 300 of the carrier 102 to the connection piece 204.

By the positively locking linking 300 of the carrier 102 to the connection piece 204, the carrier 102 can be mechanically fixed and, in addition, electrical contact can be made with said carrier.

In this case, the cavities 202, 206 can be designed for laterally and/or axially fixing the organic optoelectronic component.

In this case, the region of the positively locking linking 300 in the carrier 102 can be understood as a first fixing region 302. In this case, the region of the positively locking linking 300 in the connection piece 204 can be understood as a second fixing region 304.

The positively locking linking 300 can be formed for example with a connection structure, wherein the connection structure has a first fixing region and a second fixing region.

FIG. 4 shows a schematic cross-sectional view of different, close linkings of an organic optoelectronic component, in accordance with various configurations.

The positively locking linkings 300 illustrated are illustrated only for elucidation purposes. Elements of the individual configurations 410, 420, 430 can also be combined with one another.

Schematic cross sections of three different configurations 410, 420, 430 of positively locking linkings 300 of a carrier 102 of an optoelectronic component 100 to a connection piece 204 are illustrated.

In a first configuration 410, the first cavity 202 of the carrier 102 can have for example a cylindrical and a conical shape. by the cylindrical shape in the region of an opening of the first cavity 202, the connection structure 412, for example a rivet, can be guided in a simplified manner into the first cavity 202 and/or be fixed toward the bottom.

The region of the connection structure 412 in the first carrier 102 can also be understood as a first fixing region 302 of the connection structure 412.

The second cavity 206 of the connection piece 204 can have for example a cylindrical shape (illustrated) or a conical shape.

Generally, the shape of the cavities 202, 206 can be adapted to the shape of the connection structure 412 and be designed complementarily with respect to one another. Conversely, the shape of the connection structure 412 can also be adapted to the shape of the cavities 202, 206.

The connection structure 422 can be designed for example as a rivet 412, having a cylindrical shape and a conical shape. The first cavity 202 can be formed in such a way that the connection structure can be sunk completely in the first cavity 202, i.e. terminates flush or coplanar with the carrier 102. In this case, the shape of the first cavity 202 can be similar or identical to the shape of the connection structure, for example can have an approximately identical diameter.

In this case, the connection structure 412 can be formed in such a way that the connection structure 412 can penetrate through the carrier 102 and the connection piece 204 and a part of the connection structure 412 is still freely accessible below the connection piece 412.

In this case, the conical shape of the connection structure 412 can enable fixing of the connection structure 412 toward the bottom.

Fixing of the connection structure 412 toward the top can be realized by a rivet connection 404. In this case, the rivet connection 404 can be formed at the freely accessible region of the connection structure 412 below the connection piece 412.

In this case, the second cavity 206 can fix the connection structure 412 in the connection piece 204 in a positively locking manner. The region of the connection structure 412 in the connection piece 204 and the fixing 404 (rivet connection) can also be understood as a second fixing region 304 of the connection structure 412.

A tensioning element 402, for example a spiral spring 402, a toothed washer 402, a spring ring 402, a spring washer 402, a fan washer 402, a tensioning washer 402 or the like, can be designed between the carrier 102 and the connection piece 204.

The tensioning element 402 can optionally be assigned to the first fixing region 302 or to the second fixing region 304.

The tensioning element 402 can exert a mechanical stress on the positively locking linking 300, such that the carrier 102 is fixed relative to the connection piece 204.

The tensioning element 402 can in this case partly surround the connection structure 412.

The tensioning element 402 can additionally be designed as an electrical connection between an electrically conductive surface of the carrier 102 and an electrically conductive surface of the connection piece 204. An electrically connecting tensioning element 402 can be formed from an electrically conductive substance, for example.

As a result, an electrical connection between the carrier 102 and the connection piece 204 can be formed by the physical contacts between the tensioning element 402 and the carrier 102 and the connection piece 204.

As a result, the connection structure 412 and the rivet connection 402 can be formed from an electrically insulating substance, for example a plastic. The rivet connection 402 can be formed for example by thermal fusion of the rivet connection 404.

An electrically insulating connection structure 412 and an electrically insulating rivet connection 402 can have the advantage that it is possible to dispense with protection against electrostatic discharges over the connection structure 412, for example an insulation.

However, an electrical connection of the carrier 102 to the connection piece 204 can also be formed for example with an electrically conductive connection structure 412, since the connection structure 412 can be in physical contact with the carrier 102 and the connection piece 204.

For protection against electrostatic discharges via an electrically conductive connection structure 412, a physical contact with the electrically conductive connection structure 412 should be prevented, for example by an encapsulation (not illustrated).

In a second configuration 420, the connection structure 422 can have a conical shape corresponding, for example, to the thickness of the carrier.

In a third configuration 430, the connection structure 432 can have a thread, for example a screw 432. The connection structure 432 can be fixed with at least one complementary thread, for example by virtue of the first cavity 202 of the carrier having a thread and/or the connection structure 432 being fixed by a threaded element 408, for example a nut 408, below and/or in the connection piece 204.

In order to protect the connection piece 204, a shim 406 can be formed between nut 408 and connection piece 204.

A mechanical tension of the positively locking linking 300 can be set up by a tensioning element 402, for example. In this case, the tensioning element can be designed as an electrical connection. In addition or instead, an electrical connection between carrier 102 and connection piece 204 can be set up by an electrically conductive connection structure 432.

For protection against electrostatic discharges, the electrically conductive connection structure 432 can be surrounded by an electrically insulating encapsulation 434, for example including a plastic cap.

Figure 5:
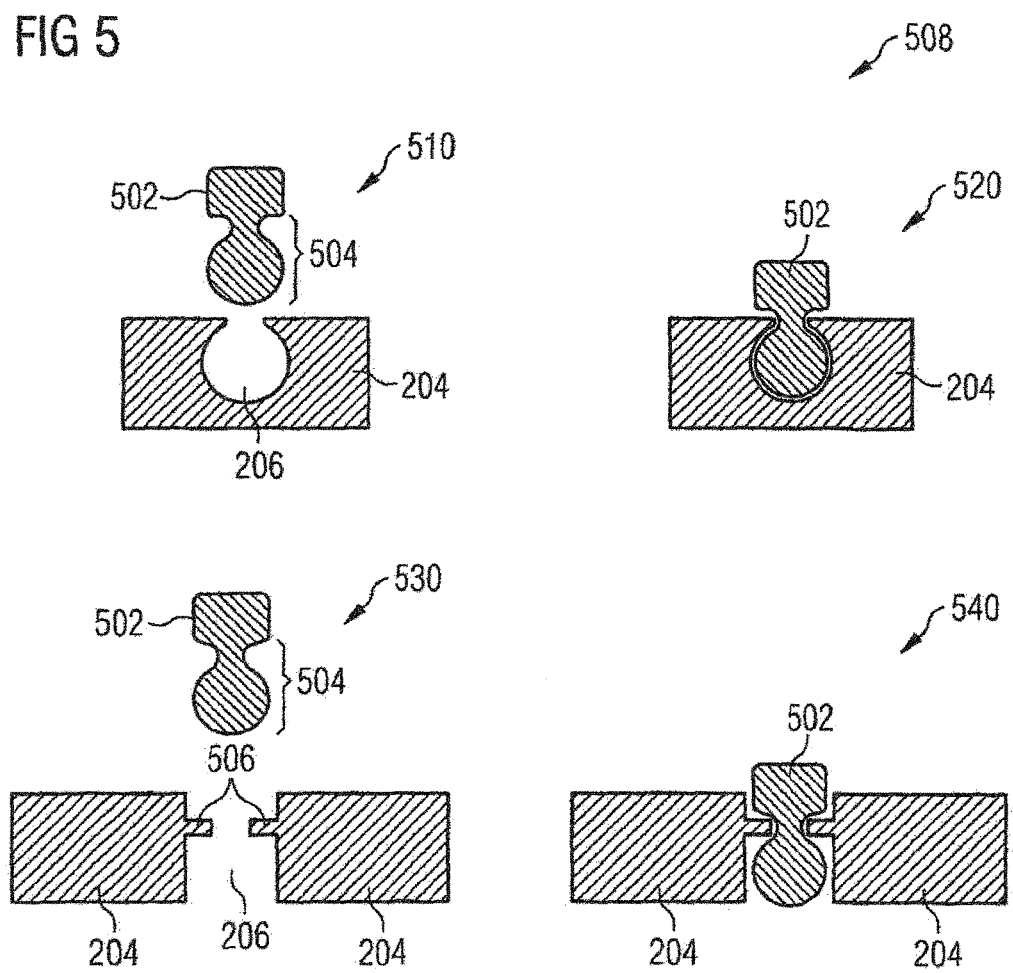
FIG. 5 shows a schematic cross-sectional view of different, close linkings, in accordance with various configurations.

FIG. 5 shows a schematic cross-sectional view of different, close linkings, in accordance with various configurations.

The positively locking linkings 510, 520, 530, 540 illustrated are illustrated merely for the purpose of elucidation. Elements of the individual configurations 520, 540 can also be combined with one another.

Schematic cross sections of two different configurations of positively locking linkings 300 of a connection structure 502 with a connection piece 204 in the open state 510, 530 and in the closed state 520, 540 are illustrated.

In this case, the connection structure 502 illustrated can be understood as a part or region of a connection structure 502, for example one of the configurations in the description of FIG. 4—also see configurations in the descriptions of FIG. 6 and FIG. 7.

In addition to or instead of the fixing of a connection structure 412, 422, 432 with a connection piece 204 by a rivet connection 404 or a nut 408, the positively locking linking 300 can be fixed and/or electrically contact-connected by a clamping unit 508 by a spring force.

For this purpose, the clamping unit 508 can have a connection structure 502 having a shaped head region 504 and a connection piece 204 having a complementarily shaped second cavity 206.

The complementarily shaped second cavity 206 be understood for example as a blind hole 206 having only one opening 510, 520 or as a ring 506 in the connection piece 204. In this case, the ring 506 can be understood as a cavity 506 in the connection piece 204 having two openings, wherein the region of the ring 506 can have a smaller thickness than the connection piece 204. In the configuration 530, 540 illustrated, the ring 506 can also be understood as a further cavity in the second cavity 206.

The closing of the clamping unit 508, i.e. the latching of the head region 504 into the complementarily shaped second cavity 206, can be formed by the elasticity of the second cavity 206 or ring 506 and/or the connection structure 502.

In addition or instead, for closing the clamping unit 508, a resilient element, for example a ring 506 with resiliently mounted ring diameter (not illustrated), can be formed laterally with respect to the connection structure in the closed state 520, 540.

The head region 504 and the complementarily shaped second cavity 206 can be formed in such a way that the positively locking linkings 300 closed by spring force cannot be opened, or can be opened only by the application of a tensile force.

The head region 504 and the complementarily shaped second cavity 206 can be formed in such a way as to facilitate opening of the clamping unit 508 when the head region 504 approaches the complementarily shaped second cavity 206, for example by a head region 504 shaped in a geometrically tapering fashion and/or by an opening of the second cavity 206 shaped in a geometrically widening fashion.

An electrically conductive connection between connection piece 204 and connection structure 502 can be formed for example by an electrically conductive connection piece 204 and an electrically conductive connection structure 502 in the closed state 520, 540.

The connection piece 204 and the connection structure 502 can be formed in accordance with one of the configurations of the connection piece 204 and/or of the connection structure 412, 422, 432, for example may include or be formed from an electrically conductive substance, for example copper, silver, gold or the like.

The connection piece 204 and the connection structure 502 may include or be formed from a substance similar or identical to that of the carrier 102.

For mechanically fixing the connection structure 502 with a connection piece 204, the connection piece 204 and the connection structure 502 may include for example a plastic, for example polypropylene, polyethylene or the like.

The plastic can have a mechanical elasticity which can enable a positively locking connection by spring force.

For an electrical connection of the connection piece 204 and the connection structure 502, the connection piece 204 and the connection structure 502 can have a partial or complete electrically conductive layer (not illustrated), for example at the respective surface, for example if the connection structure 502 and the connection piece 204 include or are formed from an electrically insulating substance.

FIG. 6 shows a schematic cross-sectional view of different, close linkings, in accordance with various configurations.

The carrier 102 and the optoelectronic layer stack 128 of the optoelectronic component 100 can be designed in accordance with one of the configurations in the description of FIG. 1.

Without restricting the generality, the configurations 600, 620 illustrated can be understood as exemplary combinations of the positively locking linking 300 of the configurations in the description from FIG. 4 and FIG. 5. The positively locking linkings 300 illustrated are illustrated only for the purpose of elucidation. Elements of the individual configurations 600, 620 can also be combined with one another and with elements of the other configurations in the descriptions of FIG. 4 and FIG. 5.

In one configuration, the connection structure 606 can have a cylindrical region and a conical region in a manner similar to the configuration 410.

The connection structure 606 can be designed for example as an electrically conductive rivet 606.

For protection against electrostatic discharges, the connection structure 606 can have an electrically insulating encapsulation 608, for example a protective cap 608.

The encapsulation 608 may include for example an electrically insulating plastic, for example polypropylene, polyethylene or the like.

The encapsulation 608 can be physically connected and fixed to the connection structure 606 by positively locking engagement, for example.

A positively locking engagement of the encapsulation 608 with the connection structure 606 can be formed for example in such a way that the encapsulation 608 partly or completely surrounds the connection structure 606 and/or is partly or completely surrounded by the connection structure 606.

The encapsulation 608 can be formed for example in the exposed region of the connection structure 606 at the surface of the carrier 102.

The encapsulation 608 can partly or completely project beyond the surface of the carrier 102 (610) or can terminate flush, i.e. coplanar, with the surface of the carrier 102 (620).

The connection structure 606 can be fixed with the carrier 102 by the first cavity 202 of the carrier, the conical region of the connection structure 606 and a rivet connection 404 in all spatial direction with regard to force actions.

The mechanical and/or electrical connection of the carrier 102 with at least one external electrical terminal 610 can be realized by a clamping unit 508 in accordance with one of the configurations in the description of FIG. 5.

In the configuration 600, a clamping unit 508 similar to the configuration 520 is illustrated.

The connection piece 204 can have a substrate 604, a clamping device 602 and external electrical terminals 610.

The clamping device 602 can have for example a spring, for example similar or identical to a leg spring, for example having at least two spring arms, wherein each spring arm is connected to the substrate 604 at at least one point and is mounted at least partly rotatably.

In the substrate 604, an electrical connection to the at least one external electrical terminal can be formed between the spring arms or the clamping device 602.

In this case, the spring arms of the clamping device 602 can be designed in such a way that a spring force is formed when the distance between the spring arms is increased.

Furthermore, the clamping device can have a region which makes it more difficult to open the clamping device from the closed state 520, for example in a manner similar to a barb. Opening the clamping device 602 from the closed state 520 may include for example applying a tensile force to the head region 504 of the connection structure 606.

Furthermore, the clamping device can have a region which makes it easier to close the clamping device from the open state 510, for example in a manner similar to a widening of the spring arms and/or springs arranged laterally with respect to the spring arms.

Opening the clamping device 602 from the open state 510 may include for example applying a compressive force to the head region 504 of the connection structure 606.

In a further configuration 620, a connection structure 614 can have elements similar or identical to those of the connection structure 432 of one of the configurations in the description of FIG. 4 and elements similar or identical to those of the connection structure 606.

The connection structure can have for example a cylindrical region and a conical region in the first cavity 202 of the carrier 102 and can be fixed with the carrier in a positively locking manner similarly to the connection structure 606.

However, the connection structure 614 can also have a thread and can be fixed to the carrier 102 with a shim 406 and a nut 408, in a manner similar to the configuration of the connection structure 432.

The electrically contact-connected substrate 616 can be formed for example in a manner similar to the substrate 604 with external terminals 610, include or be formed from a electrically conductive substance or be part of a mount of the organic optoelectronic component 100, for example a housing or frame.

FIG. 7 shows a schematic cross-sectional view of different, close linkings, in accordance with various configurations.

The carrier 102 and the optoelectronic layer stack 128 of the optoelectronic component 100 can be designed in accordance with one of the configurations in the description of FIG. 1.

Without restricting the generality, the configurations 710, 720 illustrated can be understood as exemplary combinations of the positively locking linking 300 of the configurations in the description from FIG. 4 and FIG. 5. The positively locking linkings 300 illustrated are illustrated only for the purpose of elucidation. Elements of the individual configurations 710, 720 can also be combined with one another and with elements of the other configurations in the descriptions of FIG. 4, FIG. 5 and FIG. 6.

The optoelectronic component 100 can be designed in accordance with one of the configurations in the description of FIG. 1.

In a further configuration 710, the connection structure 702 can be designed in a manner similar to the connection structure 606 in accordance with one of the configurations 600 in the description of FIG. 6.

By way of example, the connection structure 702 can be designed as a rivet 702 and can be fixed by the rivet connection 404, the shape of the rivet 702 and the complementary shape of the first cavity 202 in the carrier.

In configurations in which fixing of and/or making electrical contact with the organic optoelectronic component from the underside of the carrier 102 is necessary or desired, the clamping unit 508 can also be formed on the connection structure 702.

In this case, the underside of the organic optoelectronic component can be understood as a planar side without an optoelectronic stack 128.

The elements of the clamping unit 508 and of the electrically conductive substrate 616 can be formed in accordance with one of the configurations in the descriptions of FIG. 5 and/or FIG. 6.

In a further configuration 720, the connection structure 704 can have for example elements of the configurations of the connection structures 614 and 702.

The connection structure 704 can be fixed to the carrier 102 by shim 406 and nut 408 in a manner similar or identical to the connection structure 614.

The connection structure 704 can be electrically contact-connected or externally fixed, for example with one part 616 of a housing (not illustrated), in a manner similar or identical to the connection structure 702 by a clamping unit 508 on the connection structure 704.

For fixing the connection structure 704 to the carrier 102 with the shim 406 and the nut 408, the connection structure 704 can have, in an exposed region i.e. region freely accessible externally, a holding point 706, for example at least two plane-parallel areas for example similar to the shape of a hexagon.

In this case, the holding point 706 can be formed in such a way as to enable the fixing of the nut 408 to the connection structure 704, for example to prevent the connection structure 704 from spinning.

An exposed region for a holding points 706 can be formed for example in the region between the clamping unit 508 and the part of the connection structure 704 which is surrounded by the carrier 102.

In a further configuration, an exposed region for a holding points 706 can be formed below the nut 408 for example as a flattened portion of the thread.

FIG. 8 shows a schematic cross-sectional view of close linkings of a plurality of optoelectronic components, in accordance with various configurations.

In one configuration, the optoelectronic component device may include two or more optoelectronic components which can be fixed and/or electrically contact-connected by common connection pieces.

In this case, the two or more optoelectronic components can be electrically connected in series with one another.

For this purpose, the connection piece 204 can have two or more cavities 206.

Each of the optoelectronic components can be electrically and/or mechanically coupled to the common connection piece by a positively locking linking 300 in accordance with one of the configurations in the descriptions of FIG. 3, FIG. 4, FIG. 5, FIG. 6 and/or FIG. 7.

Adjacent optoelectronic components 100 which share a common connection piece can have identically or different positively locking linking 300.

In this case, the alignment of the optoelectronic layer stacks 128 relative to the connection piece can be dependent on the respective concrete configuration. The optoelectronic components with common connection piece 204 can be arranged in such a way that the connection piece 204 is designed on the same or different sides of the carrier 102 relative to the optoelectronic layer stacks 128.

FIG. 9 shows a schematic cross-sectional view of a close linking of an organic optoelectronic component, in accordance with various configurations.

In a further configuration, the mechanical positively locking linking 300 of the carrier 102 of an optoelectronic component 100 with a connection piece 204 can be designed for electrical contact-making.

For this purpose, the connection piece 204 can be electrically conductive or have electrically conductive regions.

In one configuration, at least one electrically conductive region of the connection piece 204 can have an electrical connection 904 to an external current source by an electrically conductive, cohesive connection 902.

The electrically conductive, cohesive connection 902 may include for example a soldering tin or an electrically conductive adhesive.

The electrical connection 904 can be realized for example by a wire 904 or by an electrical terminal 610.

FIG. 10 shows a schematic cross-sectional view of a close linking of an organic optoelectronic component, in accordance with various configurations.

In one configuration, the connection piece 204 can be designed for example as a part of a housing 1002, wherein only the connection of the connection piece 204 to a part of the housing 1002 is shown in the illustration.

The connection piece 204 can be coupled by an electrical and/or mechanical connection 1004 to a part of the housing 1002.

In this case, the electrical and/or mechanical connection 1004 can be designed as a cohesive connection, for example an electrically conductive adhesive or a soldering tin, and/or a positively locking connection, for example a positively locking linking 300 in accordance with various configurations.

FIG. 11 shows a schematic illustration of an organic optoelectronic component in the method for forming a close linking, in accordance with various configurations.

FIG. 11 illustrates on the basis of one example a positively locking connection of a connection piece 204 to a carrier 102, in accordance with various configurations. In this case, the configuration illustrated should be understood merely as one part and one example of a method for the positively locking linking of an optoelectronic component 100 to a connection piece 204 in the context of the configurations in the descriptions of FIG. 1 to FIG. 10.

The method may include providing an optoelectronic component 100 and forming 1110 a first cavity 202 in the carrier 102 of the organic optoelectronic component 100. In this case, the first cavity 202 formed in the carrier 102 is illustrated in a cross-sectional view.

In this case, the first cavity 202 can be formed in a region of the carrier 102 without an optoelectronic layer stack 128.

The connection structure 502 can be designed partly or completely in accordance with one of the configurations in the description of FIG. 2 to FIG. 10.

The optoelectronic component 100 can be designed in accordance with one of the configurations in the description of FIG. 1. The first cavity 202 can be designed in accordance with one of the configurations in the descriptions of FIG. 1 to FIG. 10.

The method may include introducing 1120 a connection structure 502 into the first cavity 202. In this case, the connection structure 502 and the first cavity 202 can be configured at least partly complementarily to one another in accordance with one of the configurations in the description of FIG. 1 to FIG. 10.

Introducing 1120 the connection structure 502 into the first cavity 202 is illustrated in a side view.

The method may include applying 1130 a fixing means 404, for example a rivet ring 404, onto or over the connection structure 502 in the first cavity 202.

The rivet ring 404 can be pushed onto the connection structure 502 for example by a first gripping unit 1108.

After applying 1130 the fixing means 404 to the connection structure 502, the method may include forming a positively locking connection 1140. In this case, fixing means 404 and connection means 502 are connected to one another in a positively locking manner. By way of example, a rivet ring 404 can be thermally and/or mechanically riveted or a nut 408 can be screwed onto a connection element 502 with a complementary thread. The rivet connection or screw connection can then fix the connection structure 502 in a force-locking manner against tensile forces relative to the carrier 102.

During riveting, by way of example, the first gripping unit 1108 can laterally exert a pressure and/or an increase in temperature on the rivet ring 404, while a second gripping unit 1106 exerts a tensile force on the connection structure 502.

In this case, the tensile force on the connection structure 502 can lead to alignment of the connection structure 502 in the first cavity 202.

The lateral pressure and/or the lateral increase in temperature exerted on the rivet ring 404 by the first gripping unit 1108 can result at least partly in mechanical squeezing or melting of the rivet ring 404. As a result, the rivet ring 404 can be closely connected to the connection structure 502.

Figure 12:
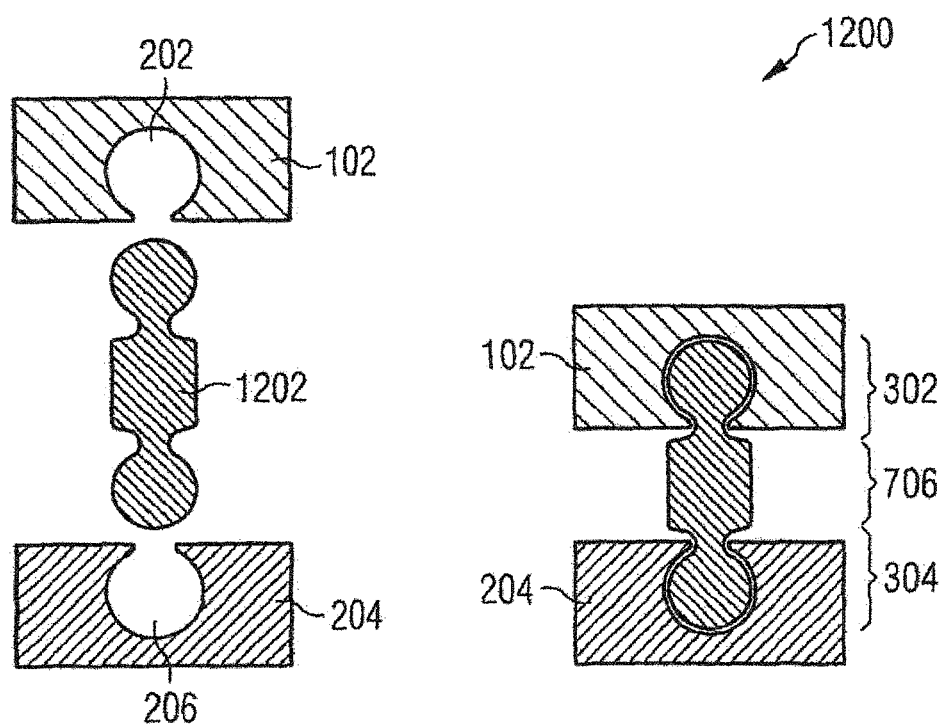
FIG. 12 shows a schematic cross-sectional view of a close linking of an optoelectronic component, in accordance with various configurations.

FIG. 12 shows a schematic cross-sectional view of a close linking of an optoelectronic component, in accordance with various configurations.

In one configuration 1200, the connection structure 502 can be formed in such a way that the carrier 102 of the organic optoelectronic component 100 and the connection piece 204 are connected to one another in a positively locking manner and/or in a force-locking manner.

The configuration 1200 illustrated can have the advantage that no screw and/or rivet connections of the connection structure 1202 on or to the carrier 102 of the organic optoelectronic component and/or the connection piece 204 are necessary.

The connection structure 1202 can have for example two or more clamping units 508 in a manner similar or identical to one of the configurations in the description of FIG. 5.

The connection structure 1202 can have a connection region 1204, wherein the the connection region 1204 can connect the clamping units 1202 to one another.

In one configuration, the connection region 1204 can be designed in a manner similar or identical to a holding point 706 of one of the configurations in the description of FIG. 7.

In one configuration, the connection region 1204 can be optional.

The connection structure 1202 can be fixed by the positively locking engagement and the force-locking engagement in the first cavity 202 and in the second cavity 206. In this case, the first fixing region 302 and/or the second fixing region 304 can be formed in such a way that the connection structure 1202 is formed in a stationary manner, i.e. in an immobile or position-invariant manner, relative to displacements resulting from a tensile force applied to the connection structure 1202, a shear force and/or a compressive force, for example by virtue of the cavities 202, 206 being formed complementarily to one another.

The cavities 202, 206 can similar or identical to a clamping device, similar or identical to one of the configurations in the description of FIG. 6; and/or similar or identical to a blind hole.

In this case, the first fixing region 302 and the second fixing region 304 can be formed similarly or identically to one another.

In various embodiments, a method for closely connecting an organic optoelectronic component to a connection piece, a connection structure for force-locking connecting and an optoelectronic component device are provided which make it possible, for example, to couple an organic light emitting diode to a connection piece in a positively locking manner and/or in a force-locking manner, electrically and/or mechanically. As a result, it is possible to dispense with a cohesive linking and to achieve a greater flexibility for the user.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for closely connecting an organic optoelectronic component to a connection piece, the method comprising:
    forming a first cavity in the organic optoelectronic component, wherein the first cavity has at least one first opening;
    introducing a connection structure through the first opening into the first cavity,
    wherein the introduced connection structure has a first fixing region, wherein the first fixing region of the connection structure is designed at least partly complementarily to the form of the first cavity;
    forming a second cavity in the connection piece, wherein the second cavity has at least one second opening; wherein the second cavity is designed at least partly complementarily to the form of a second fixing region of the introduced connection structure;
    introducing the second fixing region of the connection structure through the second opening into the second cavity; and
    forming a force-locking connection of the organic optoelectronic component to the connection piece after the connection structure has been introduced into the first cavity and the second cavity, and
    wherein during or after the process of forming the close connection of the organic optoelectronic component to the connection piece by the connection structure, an electrical connection between the optoelectronic component and the connection piece is additionally formed.

2. The method as claimed in claim 1,
    wherein during the process of introducing the connection structure into the first cavity and/or into the second cavity, at least one opening of the first cavity and/or of the second cavity has an invariant form.

3. The method as claimed in claim 1,
    wherein during the process of introducing the connection structure into the first cavity and/or into the second cavity, at least one opening of the first cavity and/or of the second cavity has a variable form.

4. The method as claimed in claim 1,
    wherein the connection structure, after the process of introducing or during the process of introducing the connection structure into the first cavity or into the second cavity, is fixed in a positively locking manner on or with the organic optoelectronic component and/or the connection piece.

5. The method as claimed in claim 4,
    wherein the positively locking fixing of the connection structure comprises a process from the group of the following processes:
    screwing; or
    riveting.

6. The method as claimed in claim 1,
    wherein the connection structure, after the process of introducing or during the process of introducing the connection structure into the first cavity and/or into the second cavity, is fixed in a force-locking manner on or with a region of the organic optoelectronic component and/or the connection piece, wherein the force-locking fixing comprises a process from the group of the following processes:
screwing;
snap-action fitting;
clamping; or
a magnetic attraction, wherein a part of the first fixing region and/or a part of the second fixing region are/is embodied in a magnetic fashion.

7. The method as claimed in claim 1,
wherein during the process of introducing the connection structure into the first cavity and/or into the second cavity, the connection structure are simultaneously or additionally introduced into at least one further cavity, wherein the further cavity is embodied in the first cavity or in the second cavity, and wherein the further cavity has at least one opening.

8. The method as claimed in claim 1,
further comprising holding the connection structure during at least one process of fixing the connection structure, wherein holding the connection structure comprises fixing the connection structure about at least one rotation axis.

9. The method as claimed in claim 1,
wherein the connection structure is firstly connected to the connection piece in a positively locking manner and/or in a force-locking manner and only afterward is the connection structure connected to the organic optoelectronic component in a positively locking manner and/or in a force-locking manner.

10. A connection structure for force-locking connecting, the connection structure at least comprising:
a first fixing region and a second fixing region;
wherein the first fixing region is designed for a force-locking of the connection structure to a first body;
wherein the second fixing region is designed for a force-locking to a second body; and
wherein the connection structure is designed in such a way that the first body is connected to the second body in a force-locking manner by the connection structure,
wherein the first fixing region and/or the second fixing region are/is designed for a clamping connection, and
wherein by the connection structure, an electrical connection between the optoelectronic component and the connection piece is additionally formed.

11. The connection structure as claimed in claim 10,
wherein the first fixing region and/or the second fixing region are/is designed similarly or identically to one of the connection structures from the group of the following connection structures:
a rivet;
a screw;
an internal thread;
a pin;
a clamp; and/or
a magnetic connection, wherein a part of the first fixing region is embodied in a magnetic fashion.

12. An optoelectronic component device,
comprising: an organic optoelectronic component, a connection piece and a connection structure between the organic optoelectronic component and the connection piece:
wherein the connection structure has a first fixing region and a second fixing region;
wherein the organic optoelectronic component has a first cavity and the connection piece has a second cavity;
wherein the first fixing region is formed at least partly in the first cavity, and wherein the second fixing region is formed at least partly in the second cavity;
wherein the first fixing region is designed at least partly complementarily to the first cavity and/or the second fixing region is designed at least partly complementarily to the second cavity;
wherein the connection structure connects the organic optoelectronic component to the connection piece in a force-locking manner, wherein the force-locking connection is formed outside the optoelectronic component and the connection structure, and
wherein by the connection structure, an electrical connection between the optoelectronic component and the connection piece is additionally formed.

13. The optoelectronic component device as claimed in claim 12,
further comprising a holder, wherein the organic optoelectronic component is held by the holder, wherein the connection piece is embodied as part of the holder.

14. The optoelectronic component device as claimed in claim 12,
wherein at least two opposite openings are formed in the first cavity and/or in the second cavity.

15. The optoelectronic component device as claimed in claim 12,
wherein the connection structure is fixed in a positively locking manner on or with a region of the organic optoelectronic component and/or of the connection piece, wherein the positively locking fixing comprises a connection from the following group:
a screw connection;
a riveted connection;
a screw connection;
a snap-action fitting;
a clamp; and/or
a magnetic attraction, wherein a part of the first fixing region and/or of the second fixing region is embodied in a magnetic fashion.

* * * * *